United States Patent [19]

Hamburgen

[11] Patent Number: 4,995,451
[45] Date of Patent: Feb. 26, 1991

[54] EVAPORATOR HAVING ETCHED FIBER NUCLEATION SITES AND METHOD OF FABRICATING SAME

[75] Inventor: William R. Hamburgen, Menlo Park, Calif.

[73] Assignee: Digital Equipment Corporation, Maynard, Mass.

[21] Appl. No.: 458,909

[22] Filed: Dec. 29, 1989

[51] Int. Cl.⁵ .......................................... H01L 23/427
[52] U.S. Cl. ............................... 165/104.33; 165/185; 165/905; 361/385
[58] Field of Search ................ 165/104.26, 185, 905, 165/104.33; 361/385

[56] References Cited

U.S. PATENT DOCUMENTS

| 3,739,235 | 6/1973 | Viessler, Jr. ............... 165/104.33 |
| 3,913,666 | 10/1975 | Bayliss ........................ 165/185 |
| 4,047,198 | 9/1977 | Sekhon et al. ............ 165/104.26 |
| 4,603,731 | 8/1986 | Olsen ........................... 165/185 |
| 4,832,118 | 5/1989 | Scanlon et al. ............ 165/905 |

Primary Examiner—Albert W. Davis, Jr.
Attorney, Agent, or Firm—Flehr, Hohbach, Test, Albritton & Herbert

[57] ABSTRACT

An evaporator comprising a graphite-Cu composite formed into a plurality of pin fins. The plurality of pin fins serve to increase the surface area of the evaporator. The evaporator surface area is processed to have a plurality of nucleation sites thereon. The evaporator may be connected directly to a integrated circuit package.

10 Claims, 3 Drawing Sheets

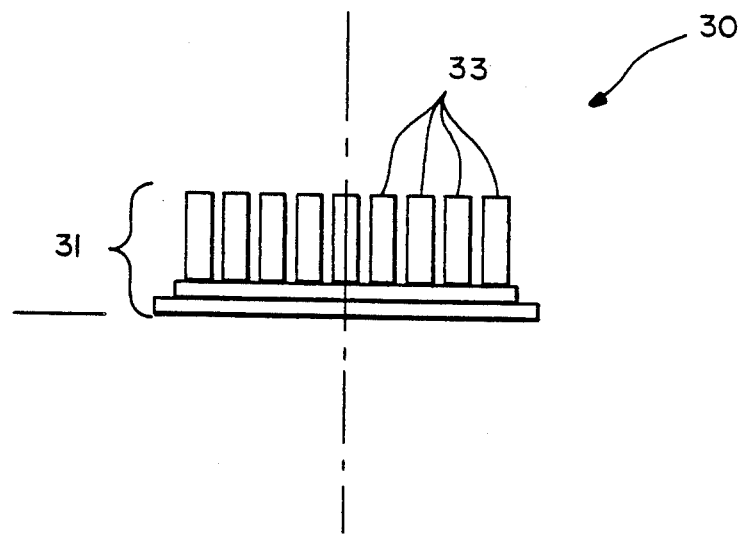
FIG.—2A
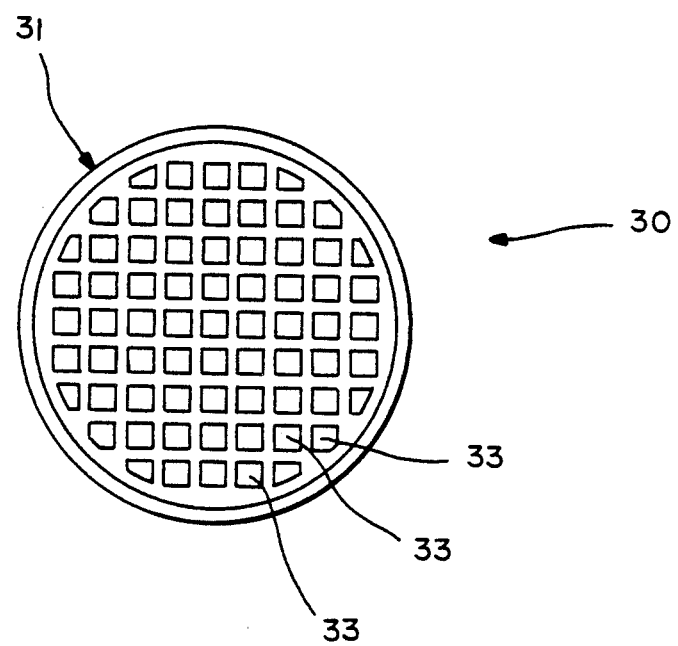
FIG.—2B

EVAPORATOR HAVING ETCHED FIBER NUCLEATION SITES AND METHOD OF FABRICATING SAME

BACKGROUND OF THE INVENTION

1. Field of the Invention

The present invention relates to heatpipes and heatpipe evaporators. More specifically, the present invention relates to increasing the surface area of an evaporator and simultaneously increasing the number of nucleation sites on the surface of an evaporator. Furthermore, the present invention uses a graphite composite to accomplish the above.

2. Summary of the Prior Art

Several prior art devices have been used to cool high power integrated circuits. They include simple approaches such as fans, and more complicated approaches involving elaborate heatpipes.

Referring to FIG. 1, a standard heatpipe and integrated circuit arrangement of the prior art is shown. The heatpipe 10 basically has two regions: a condenser 18 and an evaporator 17. The evaporator region 17 is usually comprised of a reservoir containing fluid 16 and an evaporating surface. This fluid 16 is boiled in the integrated circuit 12 cooling process and the vapors given off move through the heat tube of the heatpipe 10 to the condenser. The condenser region 18 is usually defined by the presence of heatpipe fins 19.

A heatpipe 10 may or may not have a wick. A wick is a mat or bundle of fibers or an arrangement of grooves or pores that is positioned from the evaporator region 17 to the condenser region 18. The wick collects condensation and returns it to the evaporator 17 through capillary action. The advantage of a heatpipe with a wick is that it may be positioned arbitrarily without regard for gravity. A wickless heatpipe or thermosyphion, on the other hand, must be placed upright so that condensed fluid flows back to the evaporator region 17.

As depicted from the cross-sectional view of FIG. 1, the evaporating surface is generally flat. This results in a minimum surface area and a minimum amount of fluid coming in contact with the evaporating surface. It is recognized in the prior art that by increasing the surface area, the amount of fluid contacting the evaporating surface is increased and, accordingly, the rate of cooling is increased.

In addition to increasing surface area, however, it is desirable to have a wealth of nucleation sites, microscopic re-entrant cavities that will retain small gas bubbles in the surface to initiate boiling at low wall superheats. Current techniques of increasing surface area including making cuts through the material, which is a metal, often copper, or molding the copper to have a varied surface. The greater the contours on the evaporator surface, however, the more difficult it is to operate on the surface to produce nucleation sites. For example, lasers have been used to roughen evaporator surfaces. But if grooves are cut into the evaporator to increase the surface area, it is exceedingly difficult to maneuver a laser into position to scar the walls of the cut grooves. Additionally, to the extent sufficient scarring is possible, it is a slow process and often has to be carried out one device at a time, as opposed to mass production.

Additionally, a new fiber has been developed which has interesting properties, including being over twice as thermally conductive as copper axially. These fibers are comprised of graphite.

SUMMARY OF THE INVENTION

Accordingly, it is the object of the present invention to provide an evaporator that takes advantage of the axial thermal conductivity of graphite fibers, thereby rapidly removing heat from an integrated circuit device.

It is another object of the present invention to provide an evaporator that has an enlarged surface area.

It is yet another object of the present invention to provide an evaporator with a multitude of nucleation sites created in an extended surface area, particularly by taking advantage of the physical properties of graphite to produce the nucleation sites.

The attainment of these and related objects may be achieved through use of the novel evaporator herein disclosed. An evaporator in accordance with this invention comprises a graphite-Cu composite formed into a plurality of pin fins. The plurality of pin fins serve to increase the surface area of the evaporator. The evaporator surface area is processed to have a plurality of nucleation sites thereon. The evaporator may be connected directly to a integrated circuit package or utilized in a heatpipe.

The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

FIG. 2a is a side view of the evaporator of the preferred embodiment.

FIG. 2b is a top view of the evaporator of the preferred embodiment.

DETAILED DESCRIPTION OF THE PREFERRED EMBODIMENT

Figure 1:
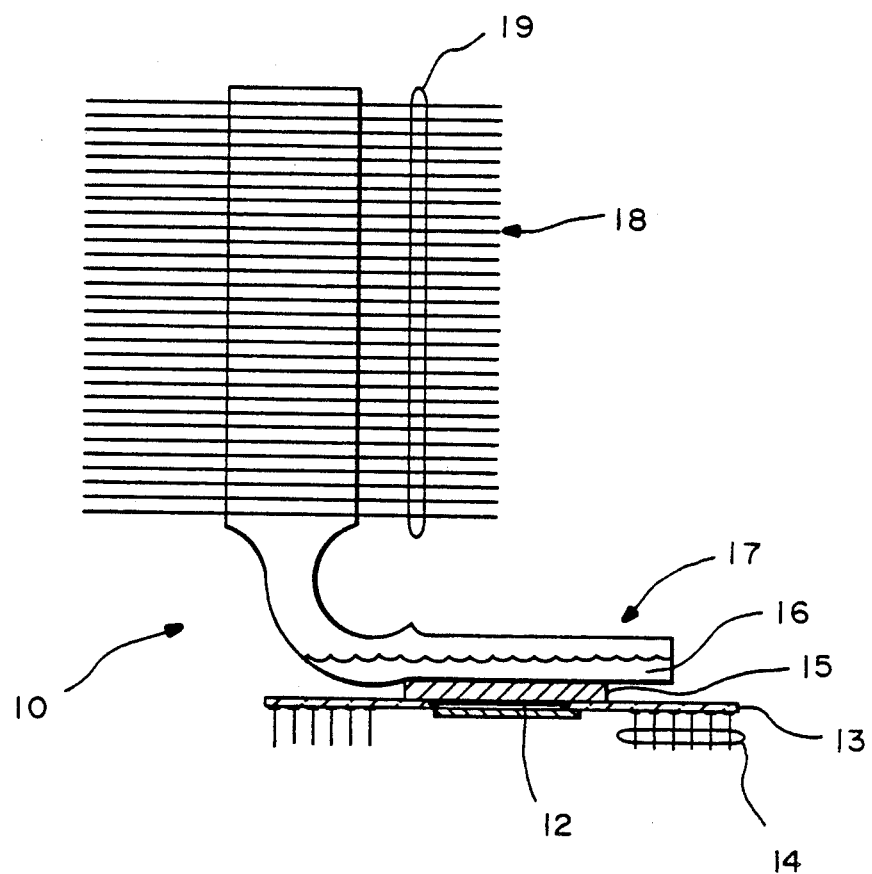
FIG. 1 is a cross-sectional view of a heatpipe arrangement of the prior art.

Referring to FIG. 1, a cross-sectional view of the heatpipe of the prior art is shown. The heatpipe 10 is used to carry away heat generated by an integrated circuit 12 (hereinafter "die 12"). A thermal spreader 15 is placed between the die 12 and the heatpipe 10. The function of the thermal spreader 15 is to spread the heat generated by the die 12 out over a larger surface area than that of the die 12 alone. The heat propagates through the thermal spreader 15 until it contacts the bottom of the heatpipe 10. Fluid 16 in the heatpipe 10 is then heated and turned to vapor which transports heat up the heatpipe 10. The phase change between from fluid to vapor is responsible for the cooling. The vapor condenses in the condenser 18 and runs back down to the evaporator region 17 (which contains the evaporator 30 of FIG. 2 in the preferred embodiment).

To connect a die 12 to a circuit board (not shown) a package 13 is provided having package pins 14. The die 12 is mounted into the package 13. A thermal spreader 15 is then mounted to the top of the die 12 and package 13. This may be accomplished by any of several well known joining techniques including adhesive bonding, soldering or brazing. The thermal spreader 15 is often made out of copper (Cu) which is well known for its thermal conductive properties. The heatpipe 10 is then joined to the thermal spreader 15. Soldering and brazing are often used to create the joint. Thus, to mount the heatpipe 10 to the die 12 (or package 13) two joints are needed. The first is the bond of the die 12 (or package 13) to the thermal spreader 15 and the second is the bond between the thermal spreader 15 and the heatpipe 10.

An evaporator region 17 is formed at the bottom surface of the heatpipe 10. In this region 17 the fluid 16 in the heatpipe 10 evaporates into a vapor, thereby promoting cooling. There are two essential physical phenomenon which must be considered in this region. The first is surface area. The second is the creation of nucleation sites or, in other words, minimizing superheating.

Addressing surface area first, the greater the surface area, the larger the amount of fluid 16 contacting the evaporating surface and accordingly, the greater the amount of heat transferred from the evaporating surface to the fluid 16. The useful area enhancement is limited only by the ability to replenish the fluid that must wet the evaporating surface for proper operation, and by the finite thermal conductivity of solid materials comprising the surface.

A second important consideration is superheating. Superheating refers to the phenomena wherein a particular fluid may boil over a range of temperatures. A primary condition affecting boiling temperature is the density of nucleation sites. A nucleation site is a microscopic re-entrant cavity (re-entrant means the opening is smaller than the inside of the cavity) that will retain small gas bubbles in the surface to initiate boiling at low wall superheats. It is well known in the art that a large number of nucleation sites promotes a lower boiling point for a fluid.

In contrast, with a smooth boiling surface there are few places for gas molecules to accumulate. As a result, a few large bubbles form which are not sufficient to create turbulence in the fluid. Under these conditions, it is possible for the temperature of fluid to rise above its boiling point before actually changing phase from fluid to vapor. For example, if the fluid 16 is water at normal atmospheric pressure, the water may reach a temperature of 215 degrees F., or even 220 degrees F. before boiling.

In cooling a die 12 it is desirable to keep the boiling point as low as possible. The greater the amount of superheating, the hotter the temperature at which the die 12 will operate. Thus, by increasing the number of nucleation sites, the overall operating temperature of the die 12 is reduced.

Referring to FIGS. 2a and 2b, a side and top view, respectively, of the evaporator 30 of the preferred embodiment is shown. A key feature of the preferred embodiment is the use of graphite fibers in an evaporator. These graphite fibers have recently become available. They have extraordinary axial thermal conductivity and low (actually negative) tropic material). A commercial example is the Amoco P-120 material which has a thermal conductivity of about twice that of copper. These fibers are being used to make metal matrix composites (typically Al or Cu) with low planar expansion coefficients and high thermal conductivity. These properties make such composites ideal substrate material for attaching large, high powered integrated circuits.

The preferred embodiment is essentially comprised of a stack 31. The stack 31 is comprised of a composite of graphite fibers and Cu. Similar metals, such as aluminum (Al), could also be used, although it is important to note that Al can only be used with certain working fluids, such as ammonia and freon. There are two primary methods for creating a stack 31. In the first method, a graphite mat (a matrix woven from graphite fibers) is provided, upon which is placed a thin Cu sheet. Upon this arrangement is placed another mat of graphite, then another thin sheet of Cu, and so on, until a stack of alternating layers of graphite and Cu is formed. The stack is then compressed under high temperature and high pressure. The result is a solid structure within which the individual layers may no longer be distinguishable from one another. In the second method, the individual graphite fibers are coated with Cu initially and then woven into a mat. These mat layers are then pressed together under high temperature and pressure to form the stack 31. This technique is practiced by American Cyanamid.

Several advantages are derived from the use of these mats. A first advantage is that in using a graphite-Cu composite matrix the mix of Cu and graphite can be controlled to control the overall thermal expansion of the material. For example, the use of a graphite-Cu composite is preferable over pure Cu because an improved expansion coefficient match can be made with the silicon integrated circuit. This enables a reliable die bond to be made. A second advantage is the improvement in planar thermal conductivity.

Regardless of the method utilized to create the stack 31, the stack 31 is then cut in such a fashion as to dramatically increase the surface area of the evaporator 30. In one preferred embodiment, the stack is machined or cut back to form an array of pin fins 33. In general, it is important that the stack be processed so as to have an enhanced surface area.

The newly defined surface is then treated to produce nucleation sites. The cut graphite-Cu stack 31 is etched, or otherwise treated, to remove a portion of the graphite fibers to a sufficient depth to form initial nucleation sites. This may be done by a combination of gas and/or liquid etchants. A preferred method, known as "ashing" the device, consists of burning away the graphite with air or oxygen at a minimum oven temperature of 400–500 degrees C. Ultrasonics may be beneficial in accelerating the etching process. It is important to note that the etched cavities should be re-entrant. This may be accomplished as part of the etching process by an etchant undercutting the passivated layer. Alternatively, this may be accomplished by plating or bead blasting to reduce the size of the opening.

An intent and result of the cutting process is that a lot of broken fibers are exposed which are then etched back to create nucleation sites. Alternative etching techniques may include mechanical, chemical (especially oxidation and plasma etch, which is similar to oxidation) and ultrasonic techniques. It is important to note that graphite and Cu have very different properties. There may be several methods of selectively attacking the graphite. The desired result is to etch back the fiber and retain copper so that a wealth of microscopie pits are formed in the surface.

Thus, the use of the above described arrangement takes advantage of the thermal conductive properties of graphite for transporting heat away from an integrated circuit. Additionally, this arrangement carries this heat to an evaporator surface which has a large surface area and a multitude of nucleation sites.

It should be appreciated that materials other than graphite could be used. Also, whiskers or chopped fiber reinforcement might prove desirable. A variant might be to use microballoons in the metal matrix; as a cutting tool hits the microballoons, it would expose a ready made cavity.

Figure 3:
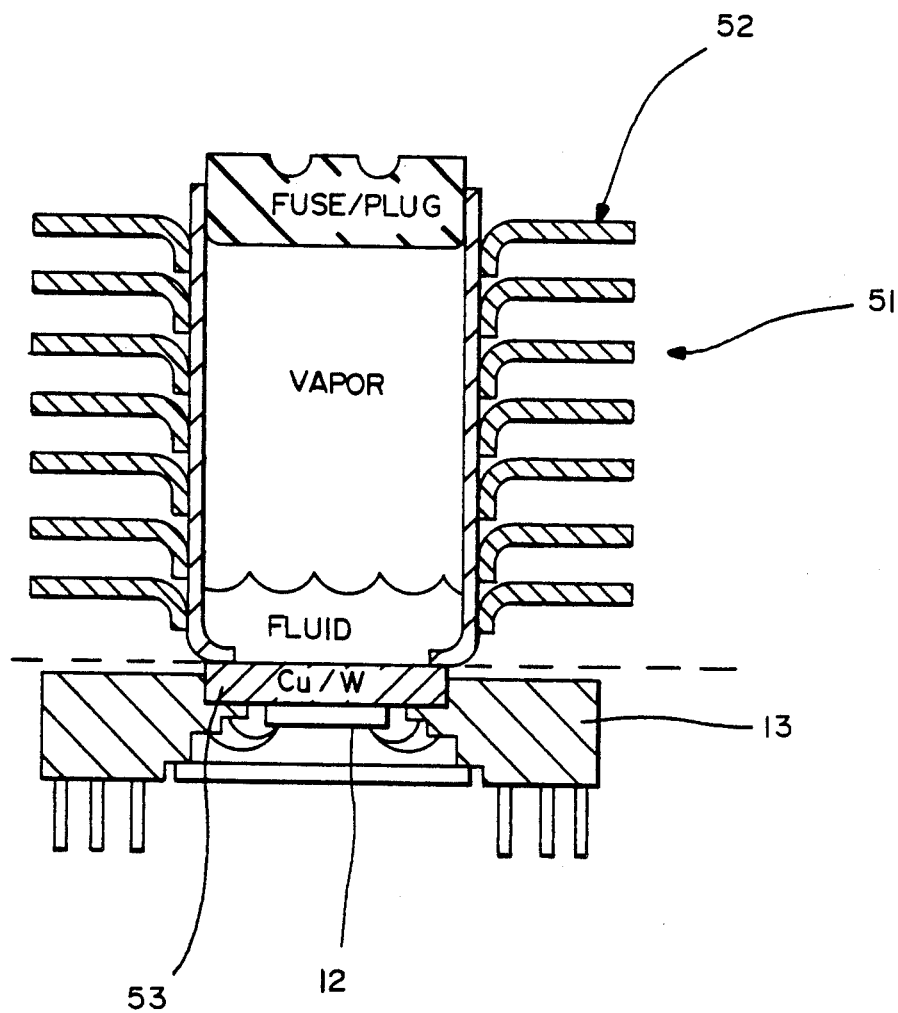
FIG. 3 is cross-sectional view of an additional feature of the preferred embodiment, the absence of a separate thermal spreader.

Referring to FIG. 3, an additional feature of the preferred embodiment is shown. Referring back to FIG. 1, a prior art heatpipe 10 arrangement is shown. Between the heatpipe 10 and the die 12 is a thermal spreader 15. As the name implies, the thermal spreader 15 spreads heat from the die 12 to a broader area of the heatpipe 10. The thermal spreader 15 is often made of metal, for example Cu or Cu-W (copper-tungsten), and has a limited range over which it can transport heat. As a general rule a heat sink device can sink larger amounts of heat if the heat can be removed from the source (the die 12) rapidly. That is the essence of using evaporators, turning the heat in fluid to heat in gas permits transport of the heat at a higher rate.

A principle aspect of the arrangement of FIG. 3 is that it eliminates an extra joint between the package 13 (or die 12) and the evaporator 51. Recall that in the prior art, attaching the package 13 to the evaporator 10 required a bond between the package 13 and the thermal spreader 15 and another between the thermal spreader 15 and the evaporator 10. Each joint requires several steps in the manufacturing process, and hence opportunities for the introduction of defects such as voids or contamination. These defects can impair heat transfer directly or lead to failure of the joint. A fractured joint can result in improper cooling and destruction of the die 12. Thus, by eliminating one of two joints, the present invention reduces by 50% the likelihood of a joint related problem.

As evident from FIG. 3, the thermal spreader 15 (of FIG. 1) is not utilized and the heatpipe 51 is connected directly to the top of the integrated circuit package 13. The package may or may not contain a slug 53. Slugs 53 are provided in some packages to improve the conduction of heat away from the die 12. In this manner, heat is delivered directly to the fluid where it is transformed into vapor and transported up the heatpipe 51 and dissipated through the fins 52. This arrangement, however, in its simplest form does not allow an optimized evaporator structure. Improvements may have to be made by machining an extended surface on the center of the slug 53 or by soldering a wick/extended surface structure to the center of the slug 53, prior to condenser assembly.

A consideration is that the surface of the package 13 may not be configured to be an evaporator and may not have a very large number of nucleation sites. The package surface may have to be operated upon in accord with the above teachings to function as an efficient evaporator. Additionally, tradeoffs are required between evaporator performance and the additional interface resistance were an extra joint to be used, as in prior art. Furthermore, the assembly process has to insure that the functional die 12 is not damaged.

To enhance cooling, the evaporator 30 (of FIG. 2) could be used in the structure of FIG. 3 by attaching the evaporator 30 directly to the package 13 in place of the slug 53 (or on top of the slug 53, depending on the configuration of the package as received from the vender). The bond between the evaporator 30 and package 13 should be hermetic, capable of surviving temperature extremes and formed by a technique which does not damage either part. The heat from the die 12 would propagate directly to the evaporator 30 and into the fluid. In this manner, the thermal spreader 15 and the inefficiencies in delivering heat that the joint between the thermal spreader and the evaporator induces will be removed. Furthermore, all the beneficial properties of the evaporator 30, listed above, can be taken advantage of.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An evaporator apparatus, comprising a reservoir containing a fluid and a plurality of graphite-metal composite pin fins in said reservoir, said pin fins each having a plurality of nucleation sites thereon.

2. The evaporator apparatus of claim 1 wherein said evaporator apparatus is contained within a heatpipe and said heatpipe and said evaporator apparatus are connected directly to an integrated circuit package without an intermediary thermal spreader.

3. An evaporator apparatus for use in a heatpipe for cooling an integrated circuit, comprising:
   a stack comprised of graphite and metal from the class containing Cu and Al; and
   said stack having an enhanced surface area.

4. The apparatus of claim 3 wherein said stack includes: a plurality of pin fins to increase the surface area of said evaporator.

5. The apparatus of claim 2 wherein said stack surface has a large number of nucleation sites.

6. The apparatus of claim 3 wherein said integrated circuit is contained in a package and said heatpipe is connected directly to said integrated circuit without an intermediary thermal spreader.

7. The evaporator apparatus of claim 3 wherein said evaporator apparatus is contained within said heatpipe and said heatpipe and said evaporator apparatus are connected directly to a package containing said integrated circuit without utilization of an intermediary thermal spreader.

8. An evaporator apparatus being fabricated primarily of a composite including graphite and a metal from the class consisting of Al and Cu, said evaporator apparatus having a plurality of pin fins for maximizing the surface area of said evaporator apparatus, said surface area having a multitude of nucleation sites created therein.

9. The apparatus of claim 8, further comprising a base, said plurality of pins fins extending from said base.

10. The evaporator apparatus of claim 8 wherein said evaporator apparatus is contained within a heatpipe and said heatpipe and evaporator apparatus are connected directly to an integrated circuit package without an intermediary thermal spreader.

* * * * *